(12) United States Patent
Chan et al.

(10) Patent No.: US 11,642,682 B2
(45) Date of Patent: *May 9, 2023

(54) PIPE DESIGN FOR PREVENT DRIP

(71) Applicant: TAIWAN SEMICONDUCTOR MANUFACTURING COMPANY, LTD., Hsinchu (TW)

(72) Inventors: Channing Chan, Hsinchu (TW); Kuo-Shu Tseng, Hsinchu (TW); Chun-Chih Lin, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 122 days.

This patent is subject to a terminal disclaimer.

(21) Appl. No.: 17/115,265

(22) Filed: Dec. 8, 2020

(65) Prior Publication Data

US 2021/0086207 A1 Mar. 25, 2021

Related U.S. Application Data

(63) Continuation of application No. 15/904,903, filed on Feb. 26, 2018, now Pat. No. 10,864,533.

(60) Provisional application No. 62/525,271, filed on Jun. 27, 2017.

(51) Int. Cl.
| | | |
|---|---|---|
| *B05B 1/30* | (2006.01) | |
| *B05B 13/04* | (2006.01) | |
| *B05B 1/18* | (2006.01) | |
| *H01L 21/67* | (2006.01) | |
| *B08B 3/02* | (2006.01) | |

(Continued)

(52) U.S. Cl.
CPC ................ *B05B 1/185* (2013.01); *B05B 1/30* (2013.01); *B05B 13/0431* (2013.01); *B08B 3/024* (2013.01); *B08B 3/08* (2013.01); *H01L 21/6708* (2013.01); *H01L 21/67023* (2013.01); *H01L 21/67051* (2013.01); *B08B 3/10* (2013.01)

(58) Field of Classification Search
CPC ......... H01L 21/67017; H01L 21/67023; H01L 21/67028; H01L 21/6704; H01L 21/67051; H01L 21/67063; H01L 21/67075; H01L 21/6708; H01L 21/6715; B05B 1/14; B05B 1/185; B05B 1/30; B05B 13/0431; B08B 3/024; B08B 3/08; B08B 3/10
See application file for complete search history.

(56) References Cited

U.S. PATENT DOCUMENTS

| | | |
|---|---|---|
| 4,941,428 A | 7/1990 | Engel |
| 5,935,375 A | 8/1999 | Nakazawa et al. |
| 5,962,070 A | 10/1999 | Mitsuhashi et al. |

(Continued)

*Primary Examiner* — Darren W Gorman
(74) *Attorney, Agent, or Firm* — Hauptman Ham, LLP

(57) ABSTRACT

A nozzle assembly for use in liquid-dispensing system, the nozzle assembly including: a body configured to receive a pipe; and the pipe, an end of the pipe being mounted on the body. The pipe includes multiple lumens correspondingly terminated in multiple orifices such that a liquid is escapable from each lumen through the corresponding orifice and is thereby dispensable from the nozzle assembly. The pipe has a first flow-capacity to supply a first volume of the liquid at a first flow-rate and at a first pressure. Each orifice and corresponding lumen has a second flow-capacity to supply a second volume of the liquid at a second flow-rate and at a second pressure.

20 Claims, 8 Drawing Sheets

(51) Int. Cl.
*B08B 3/08* (2006.01)
*B08B 3/10* (2006.01)

(56) References Cited

U.S. PATENT DOCUMENTS

| | | |
|---|---|---|
| 6,247,479 B1 | 6/2001 | Taniyama et al. |
| 6,403,500 B1 | 6/2002 | Yu et al. |
| 7,306,114 B2 | 12/2007 | Nguyen |
| 8,864,055 B2 * | 10/2014 | Fugere ................ B05B 7/0466 239/602 |
| 2005/0061830 A1 | 3/2005 | Zanotti |
| 2007/0145164 A1 | 6/2007 | Ahmadi et al. |
| 2008/0251107 A1 | 10/2008 | Osada et al. |
| 2009/0114253 A1 * | 5/2009 | Matsumoto ....... H01L 21/02052 134/30 |
| 2015/0053244 A1 | 2/2015 | Sato et al. |
| 2015/0179483 A1 | 6/2015 | Tseng et al. |
| 2015/0343495 A1 | 12/2015 | Kim et al. |
| 2015/0364345 A1 * | 12/2015 | Camargo .......... H01L 21/67051 134/153 |
| 2016/0247697 A1 | 8/2016 | Sawashima et al. |
| 2017/0096326 A1 * | 4/2017 | Nasman ............... B05C 5/0225 |

\* cited by examiner

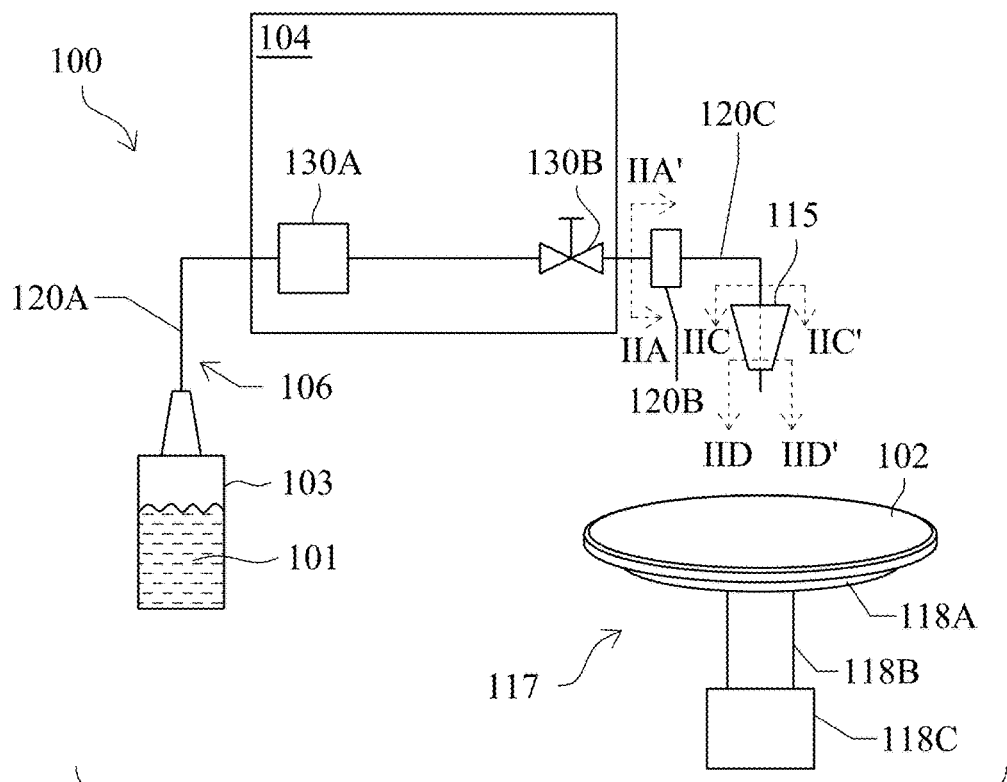
FIG. 1
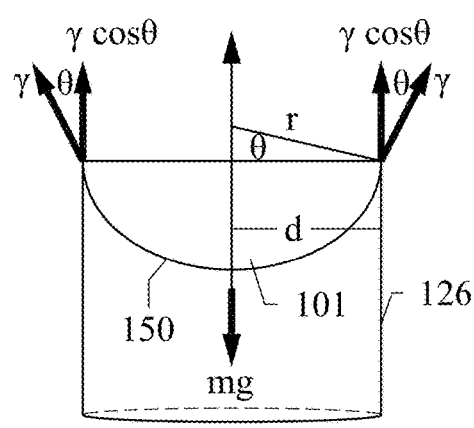
FIG. 2B
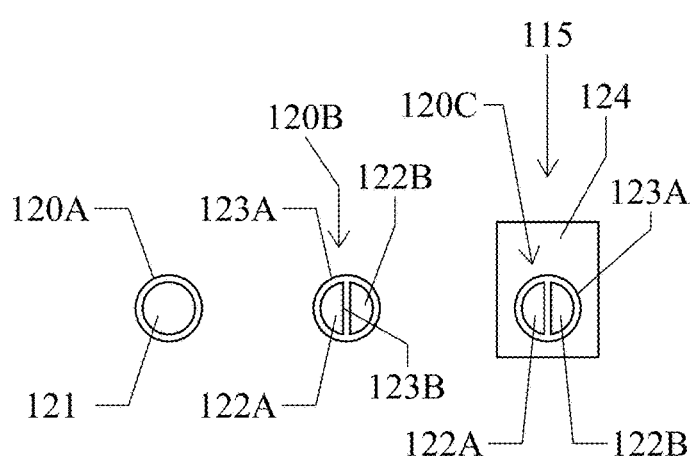
FIG. 2A  FIG. 2D
FIG. 2C

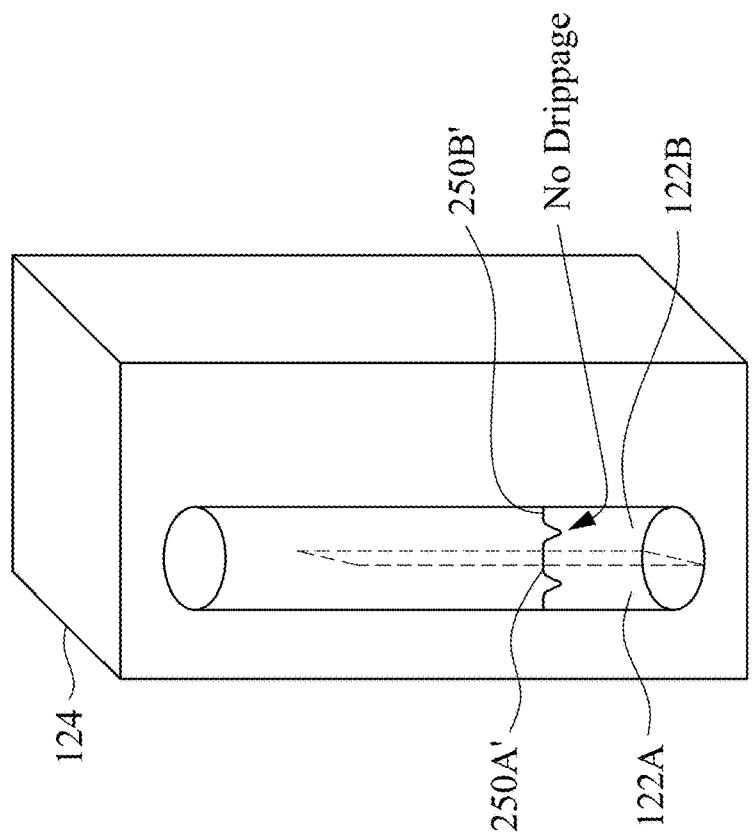
FIG. 2F (While Subjected to Acceleration)
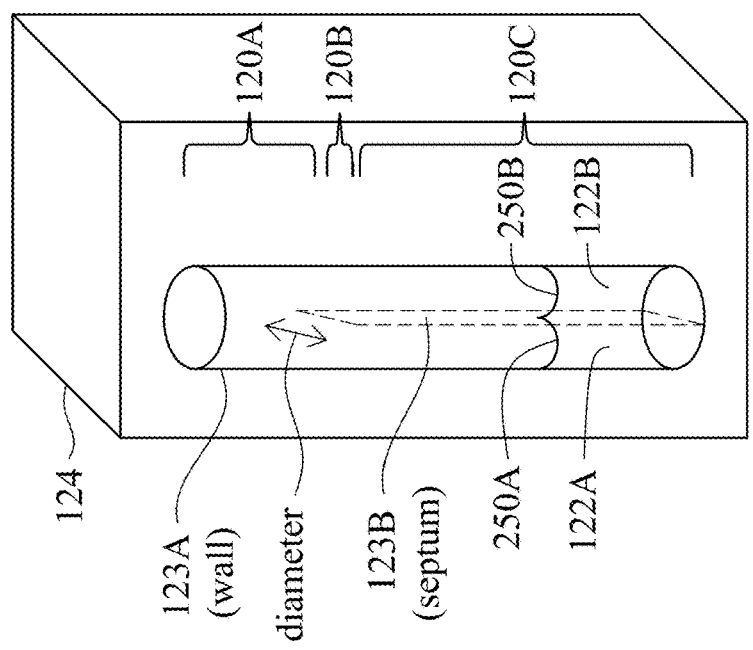
FIG. 2E (While Motionless)

PIPE DESIGN FOR PREVENT DRIP

PRIORITY CLAIM

The present application is a continuation of U.S. application Ser. No. 15/904,903, filed Feb. 26, 2018, now U.S. Pat. No. 10,864,533, issued Dec. 15, 2020, which claims the priority of U.S. Provisional Application No. 62/525,271, filed Jun. 27, 2017, which are incorporated herein by reference in their entireties.

BACKGROUND

In the context of integrated circuit (IC) fabrication, a wafer of semiconductor material is subjected to multiple processes including dispensing a liquid onto the wafer. For a typical dispensation, a liquid is dispensed from a nozzle. When the dispensation ends, liquid remains in the nozzle. As the nozzle is moved, it is subjected to accelerations.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a diagram of a system for dispensing a liquid, in accordance with at least one embodiment of the present disclosure.

FIGS. 2A and 2C-2D are cross-sections of a conduit assembly, in accordance with at least one embodiment of the present disclosure.

FIG. 2B is a plot of an equation for representing surface tension of liquid in a pipe, in accordance with at least one embodiment of the present disclosure.

FIGS. 2E-2F are three-quarter perspective views which relate to corresponding FIGS. 2A and 2D, in accordance with at least one embodiment of the present disclosure.

DETAILED DESCRIPTION

Figure 3A:
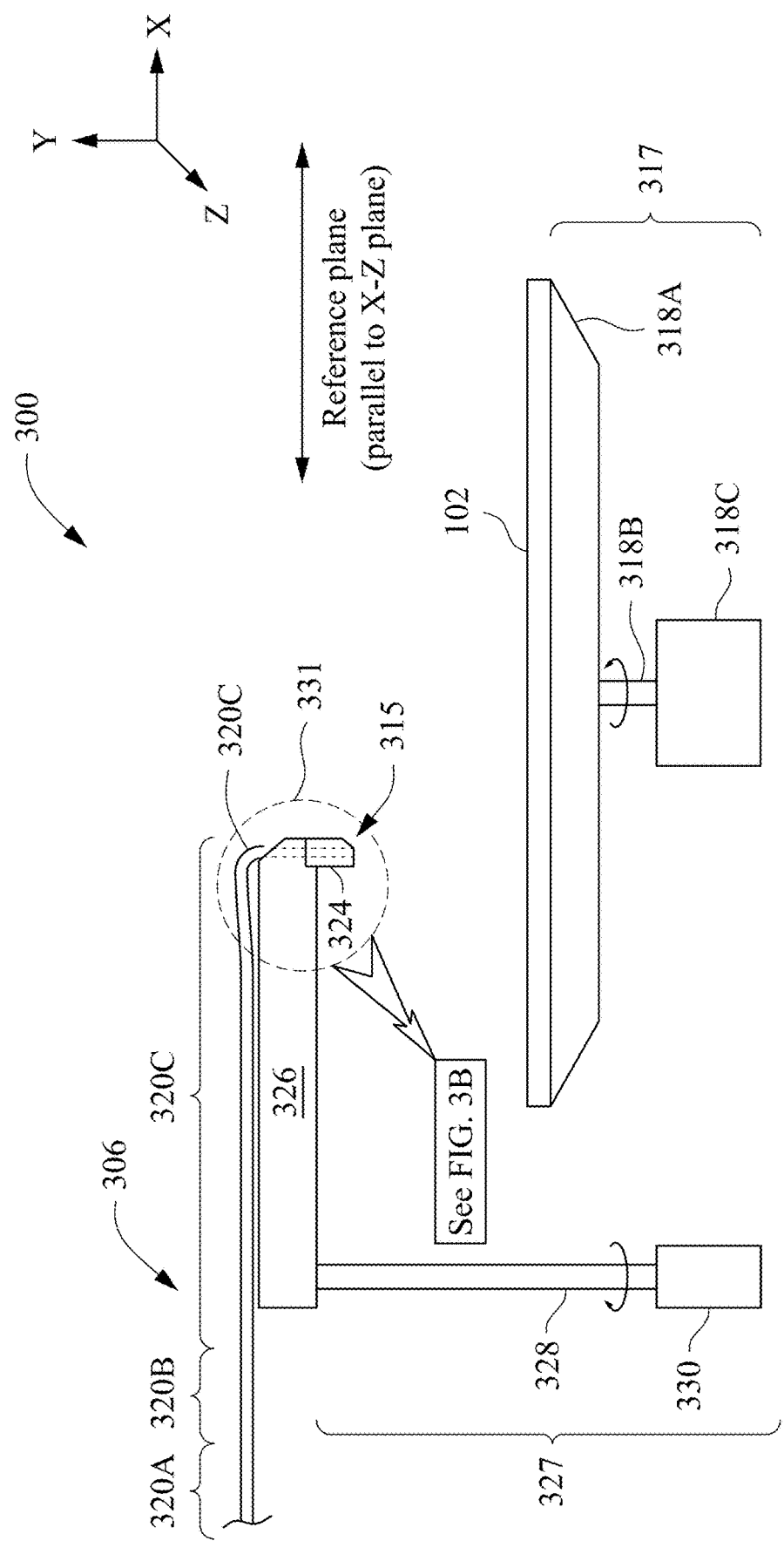
FIG. 3A is a diagram of a system for moving a nozzle assembly, in accordance with at least one embodiment of the present disclosure.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. System may be otherwise oriented (rotated 90 degrees or at other orientations) and the spatially relative descriptors used herein may likewise be interpreted accordingly.

A nozzle, used to dispense a liquid onto a wafer of semiconductor material, has a pipe which has a single larger lumen. The larger lumen has a first cross-section, which is circular and has a first cross-sectional area. The larger lumen terminates in a single larger orifice through which the liquid is dispensed onto the wafer. Relative to a given liquid, the nozzle is sized to have a first flow-capacity. The first cross-sectional area of the single lumen produces a first surface tension of the liquid which is insufficient to substantially prevent drippage of the liquid when the larger lumen is subjected to acceleration after the dispensation ends (again, there remaining liquid in the larger lumen). According to at least one embodiment of the present disclosure, a nozzle is provided with a pipe which has multiple smaller lumens, e.g., each of which has substantially a same second cross-section, each second cross-section having a second cross-sectional area. The liquid is dispensed through the multiple smaller orifices of the multiple smaller lumens onto the wafer. The second cross-sectional area is sized so that each smaller lumen produces a second surface tension of the liquid which is sufficient to substantially prevent drippage of the liquid when the smaller lumen is subjected to acceleration after the dispensation ends (and while there remains liquid in the smaller lumen). The sum of the second cross-sectional areas of the multiple smaller lumens results in a net flow-capacity of the multiple smaller lumens which is substantially the same as the first flow-capacity of the single larger lumen.

FIG. 1 is a diagram of a system 100 for dispensing a liquid, in accordance with at least one embodiment of the present disclosure.

In system 100, a liquid 101 is dispensable onto a substrate such as a wafer 102. In some embodiments, system 100 is used in the context of integrated circuit (IC) fabrication, where wafer 102 is subjected to multiple processes including dispensing liquid 101 onto wafer 102. In some embodiments, liquid 101 is an etchant. In some embodiments, liquid 101 is a cleanser. In some embodiments, liquid 101 is a rinsing agent. In some embodiments, liquid 101 is deionized water. In some embodiments, liquid 101 is a surfactant.

System 100 includes a carrier assembly 117 on which wafer 102 is disposable. Carrier assembly 117 includes: a chuck 118A to which wafer 102 is removably mounted; a spindle 118B to which chuck 118A is mounted such that chuck 118A is rotatable around a long axis of spindle 118B; and a motor 118C to rotate spindle 118B around the long axis of spindle 118B, and thereby rotate chuck 118A. Chuck 118A is configured to hold wafer 102 substantially parallel to a reference plane. In some embodiments, system 100 further includes a first controller (e.g., a computer) (not shown in FIG. 1) to control the operation of motor 118C and thereby control the rotation of chuck 118A.

System 100 further includes a storage unit 103 for storing liquid 101, a pressurizing mechanism 104 for pressurizing liquid 101 and a nozzle assembly 115 from which liquid 101 is dispensed. A conduit assembly 106, in which flows liquid 101, fluidically connects together: storage unit 103; pressurizing mechanism 104; and nozzle assembly 115. In particular, conduit assembly 106 fluidically connects: storage unit 103 to pressurizing mechanism 104; and pressurizing mechanism 104 to nozzle assembly 115.

Pressurizing mechanism 104 includes: a pump 130A; and a valve 130B. Conduit assembly 106 fluidically connects storage unit 103 to pump 130A; pump 130A to valve 130B; and valve 130B to nozzle assembly 115. 130B In some embodiments where system 100 is used in the context of integrated circuit (IC) fabrication, wafer 102 includes a semiconductor material such as silicon or the like. In some embodiments, alternatively or additionally, wafer 102 includes other elementary semiconductor materials such as germanium (Ge). In some embodiments, wafer 102 includes a compound semiconductor such as silicon carbide (SiC), gallium arsenic (GaAs), indium arsenide (InAs), or indium phosphide (InP). In some embodiments, wafer 102 includes an alloy semiconductor such as silicon germanium (SiGe), silicon germanium carbide (SiGeC), gallium arsenic phosphide (GaAsP), or gallium indium phosphide (GaInP). In some embodiments, wafer 102 includes multiple layer of materials. In some embodiments, wafer 102 includes one or more epitaxial layers. For example, wafer 102 has an epitaxial layer overlying a bulk semiconductor. In some other embodiments, wafer 102 is a silicon-on-insulator (SOI) or a germanium-on-insulator (GOI) substrate. In some embodiments, one of more of the multiple layer includes semiconductor material and one or more of the layers includes material used in other processes associated with IC fabrication.

In some embodiments, wafer 102 includes various device elements which have been formed in wafer 102. Examples of device elements included as being formed in wafer 102 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or the like.

In some embodiments, liquid 101 is a chemical used in a semiconductor fabrication process. In some embodiments, liquid 101 includes a chemical used in a photolithography process.

In some embodiments, pump 130A receives liquid 101 from storage unit 103 and pumps liquid 101 to nozzle assembly 115 by which liquid 101 is dispensed onto wafer 102. In some embodiments, valve 130B is positioned between pump 130A and nozzle assembly 115. Valve 130B is configured to regulate the flow of liquid 101 from pump 130A to nozzle assembly 115. In some embodiments, system 100 further includes a second controller (e.g., a computer) (not shown in FIG. 1) to control valve 130B according to a predetermined setting. In some embodiments, the first and second controllers are the same controller.

In system 100, conduit assembly 106 has multiple portions including a first portion 120A, a manifolding portion 120B and a second portion 120C. First portion 120A of conduit assembly 106 is shown as serially fluidically connecting storage unit 103, pump 130A, valve 130B and manifolding portion 120B. As such, first portion 120A is understood as including sections (not individually numbered in FIG. 1) which connect: storage unit 103 to pump 130A; pump 130A to valve 130B; and valve 130B to manifolding portion 120B. Manifolding portion 120B of conduit assembly 106 fluidically connects first port 120A of conduit assembly 106 to second portion 120C of conduit assembly 106. Second portion 120C fluidically connects manifolding portion 120B to nozzle assembly 115.

In some embodiments, each of one or more of the sections of first portion 120A of conduit assembly 106 is of unitary construction. In some embodiments, manifolding portion 120B is of unitary construction. In some embodiments, second portion 120C is of unitary construction. In some embodiments, manifolding portion 120B and second portion 120C are of unitary construction. As used herein, and when applied to an object, the term "unitary construction" is to be understood as meaning that the object is fabricated as a single piece of material. Among other things, an object of unitary construction is seamless. By contrast, as used herein, an assembly is to be understood as including multiple separate parts which are joined together in some manner, e.g., friction-fitting, mechanical connection, chemical connection such as adhesion, or the like. As such, in an assembly, one or more of the parts may be of unitary construction. Also, as used herein, and when applied to an object of unitary construction (whether or not the object represents a part which is included in an assembly), and more particularly when applied to first and second adjacent portions of the object, the term "integral" is to be understood as meaning that there is no joint, seam, or material boundary between the first and second portions.

Any one or more of the sections of first portion 120A of conduit assembly 106, manifolding portion 120B and second portion 120C is fabricable of extrudable material in an extrusion process. In some embodiments, the results of the extrusion process is that any one or more of the sections of first portion 120A of conduit assembly 106, manifolding portion 120B and second portion 120C is of unitary construction. In some embodiments, any one or more of the sections of first portion 120A of conduit assembly 106, manifolding portion 120B and second portion 120C is an assembly. In some embodiments, where any one or more of the sections of first portion 120A of conduit assembly 106, manifolding portion 120B and second portion 120C is an assembly, one or more parts of one or more of the sections of first portion 120A of conduit assembly 106, manifolding portion 120B and second portion 120C is fabricable of extrudable material in an extrusion process.

First portion 120A has a first length and includes M instances of a first lumen, where M is a positive integer. Each instance of the first lumen is coextensive with the first length. Second portion 120C has a second length and includes N instances of a second lumen, where N is a positive integer and N is greater than or equal to M (N≥M). In some embodiments, N is greater than M (N>M). Each instance of the second lumen is coextensive with the second length.

FIG. 2A illustrates a first cross-section of first portion 120A of conduit assembly 106, in accordance with at least one embodiment of the present disclosure.

Each instance of the first lumen in first portion 120A of conduit assembly 106 has a first cross-section, which has a first cross-sectional area. In FIG. 2A, M is shown as M=1 such that there is a single lumen in first portion 120A. The first cross-sectional area of the single lumen of first portion 120A has size $A_1$.

In FIG. 2A, the first cross-section (of first portion 120A) includes a single lumen 121. First cross-section of lumen 121 is circular. In some embodiments in which there is a single second lumen (N=1), the cross-sectional shape of the first lumen is a shape other than a circle such as an ellipse, a parallelepiped, a triangle, or the like.

Returning to FIG. 1, relative to a given composition of liquid 101, the first cross-sectional area, $A_1$, of the first lumen of first section 120A, is sized to have a first flow-capacity, $FC_1$. In some embodiments, the first flow-capacity is sufficient to supply a first volume of the liquid at a first flow-rate and at a first pressure.

In some embodiments, there are more than one instance of the first lumen (M>1). In some embodiments where M>1, each instance of the first lumen has substantially the same cross-section and the corresponding cross-sectional areas of the instances of the first lumen have substantially the same size. In some embodiments where M>1, at least some of the instances of the first lumen have different cross-sections and the corresponding cross-sectional areas of the instances of the first lumen have different sizes.

FIG. 2B is a plot of an equation for representing surface tension, $F_S$, of liquid in a pipe, in accordance with at least one embodiment of the present disclosure.

In FIG. 2B, the pipe is shown as having sidewalls 126. More particularly, FIG. 2B is a plot of $F_S = 2\pi * d * d * \gamma / r$, where $\gamma$ is gravitational force; $\cos \theta = d/r$, r is the radius of curvature of a surface 150 of liquid 101, and d is the radius of the pipe. Gravitational force on liquid 101, $\gamma$, is represented by the equation $\gamma = m * g$, where g is gravitational acceleration and m is the mass of liquid 101. In some embodiments, for the cross-sectional area of lumen 122A/122B (see FIG. 2C discussed below), the gravitational force becomes 0.5*original=0.5*m*g. The force of surface tension, $F_S$, is bigger than 0.5*original=0.5*2 $\pi * (d+d) * d * \gamma / r$. Hence, drippage of liquid 101 is discouraged by the cross-sectional configuration of lumen 122A/122B.

FIG. 2C illustrates a second cross-section of second portion 120B of conduit assembly 106, in accordance with at least one embodiment of the present disclosure.

Each instance of the second lumen in second portion 120C of conduit assembly 106 has a second cross-section, which has a second cross-sectional area, $A_2$. In FIG. 2C, N is shown as 2 such that there are two lumens in second portion 120C.

In FIG. 2C, the second cross-section (of second portion 120C) includes two lumens 122A and 122B. Section 120C includes a wall 123A and a septum (or bulkhead) 123B. In cross-section, septum 123B bifurcates the space enclosed by wall 123A, thereby forming lumens 122A and 122B. In some embodiments, the diameter of section 120C is about 12 millimeters. In some embodiments, the thickness of wall 123A is about 1 millimeter. In some embodiments, the thickness of septum 123B is about 0.1-1.0 millimeter. The second cross-sections of corresponding lumens 122A and 122B are semicircles. The semicircles of FIG. 2A have corresponding second cross-sectional areas which are substantially the same size $A_2$. In some embodiments in which N=2, the cross-sectional shapes are shapes other than semicircles. In some embodiments in which N=2, the cross-sectional shapes of corresponding lumens 122A and 122B have different cross-sectional areas. In some embodiments in which N=2, each of the cross-sectional shapes of lumens 122A and 122B is a circle. In some embodiments in which N=2 and each of the cross-sectional shapes of lumens 122A and 122B is a circle, the corresponding cross-sectional areas are the same size.

Returning to FIG. 1, relative to the given composition of liquid 101, each of the second cross-sectional areas of the second lumens of second section 120C is sized to have a second flow-capacity $FC_2$. In some embodiments, the second flow-capacity is sufficient to supply a second volume of the liquid at a second flow-rate and at a second pressure. The second flow-capacity is smaller than the first flow-capacity, $FC_2 < FC_1$. The second cross-sectional area, $A_2$, is smaller than the first cross-sectional area, $A_1$, such that $A_2 < A_1$.

Furthermore, the second cross-sectional area is sized as $A_2$ so that each of lumens 122A and 122B produces a surface tension of the given composition of liquid 101 which is sufficient to overcome the force of gravity on liquid 101 and thereby substantially prevent drippage of liquid 101 from the corresponding orifices of lumens 122A and 122B when lumens 122A and 122B are subjected to acceleration after a dispensation of liquid 101 ends (and while there remains some amount of liquid 101 in lumens 122A and 122B). In some embodiments in which nozzle assembly 115 is mounted to a movable arm (see arm 326 FIG. 3B, discussed below), nozzle assembly 115 is subjected to acceleration when moved by the arm. In some embodiments, the nozzle assembly 115 is moved at rates up to about 350 millimeters/sec by the movable arm. The sum of the second cross-sectional areas $A_2$ of second lumens 122A and 122B, $\Sigma = 2 * A_2$, results in a net flow-capacity which is substantially the same as the first flow-capacity of single lumen 121.

In some embodiments, N>2. In some embodiments, where N≥2, each instance of the second lumen has the same cross-section and the corresponding cross-sectional areas of the instances of the second lumen have the same size. In some embodiments, where N≥1, at least some of the instances of the second lumen have different cross-sections and the corresponding cross-sectional areas of the instances of the second lumen have different sizes.

As noted, manifolding portion 120B fluidically connects first portion 120A to second portion 120C. Manifolding portion 120B includes a first stage (not shown in FIG. 1 but see, e.g., 640A of FIG. 6A, discussed below); a manifold (not shown in FIG. 1 but see 640B of FIG. 6A, discussed below); and a second stage (not shown in FIG. 1 but see, e.g., 640C of FIG. 6A, discussed below). The first stage includes N instances of a third lumen which are correspondingly fluidically connected to, and correspondingly configured substantially the same as, the N instances of the first lumen of first portion 120A. The second stage includes M instances of a fourth lumen which are correspondingly fluidically connected to, and correspondingly configured substantially the same as, the M instances of the second lumen of second portion 120C. The manifold includes a chamber to which are fluidically connected the N instances of the third lumen and the M instances of the fourth lumen.

In system 100, nozzle assembly 115 includes a body/chassis (not illustrated in FIG. 1 but see, e.g., 124 FIG. 2D) and a segment of second portion of conduit assembly 106. The body/chassis of nozzle assembly 115 is configured to receive a segment of second portion 120C. In FIG. 1, an end of portion 120C (from which liquid 101 is dispensed) extends beyond a face of the body/chassis of nozzle assembly 115. In some embodiments, the end of portion 120C is disposed substantially flush with the face of the body/chassis.

FIG. 2D is a cross-section of nozzle assembly 115, in accordance with at least one embodiment of the present disclosure.

In FIG. 2D, nozzle assembly 115 includes body/chassis 124 and second portion 120C. Again, second portion 120C includes two second lumens 122A and 122B.

FIGS. 2E-2F are three-quarter perspective views which relate to corresponding FIGS. 2A and 2D, in accordance with at least one embodiment of the present disclosure.

In FIG. 2E, septum 123B results in a smaller radius of curvature for each of a surface 250A and surface 250B of liquid 101 than would exist without septum 123B (as in the cross-section of FIG. 2A). FIG. 2E assumes a circumstance in which body/chassis 124 is not subjected to acceleration and thus is motionless. FIG. 2F assumes a circumstance in which body/chassis 124 is subjected to acceleration. While the acceleration changes the shapes of surfaces 250A' and 250B' of liquid 101, nevertheless FIG. 2F shows that the smaller radii of curvature discourage (if not prevent) drippage of liquid 101.

FIG. 3A is a diagram of a system 300 for moving nozzle assembly 115, in accordance with at least one embodiment of the present disclosure. Some of the reference numerals in FIG. 3A correspond to reference numerals in FIG. 1 albeit increased by a factor of 200. For example, nozzle assembly 315 of FIG. 3A corresponds to nozzle assembly 115 of FIG. 1.

System 300 includes nozzle assembly 315, an arm 326, and an arm-rotation mechanism 327. Arm-rotation mechanism includes a spindle 328 and a motor 330. Nozzle assembly 315 includes a body/chassis 324. Body/chassis 324 is mounted to a distal end of arm 326. A proximal end of arm 326 is mounted to spindle 328 such that arm 326 is rotatable around a long axis of spindle 328. Spindle 328 is mounted to motor 330 such that spindle 328 is rotatable around the long axis of spindle 328 by motor 330. Rotation of spindle 328 also rotates arm 326 and body/chassis 324. In some embodiments, system 300 further includes a second controller (e.g., a computer) (not shown in FIG. 3A) to control the operation of motor 330 and thereby control the rotation of body/chassis 324. In some embodiments, arm-rotation mechanism is configured to move arm 326, and thereby body/chassis 324, over wafer 102 such that motion of body/chassis 324 is at least within a movement plane which is substantially parallel to the reference plane. Again, wafer 102 is held substantially parallel to the reference plane by chuck 318A. In some embodiments, arm-rotation mechanism is configured to move arm 326 in three dimensions.

Figure 3B:
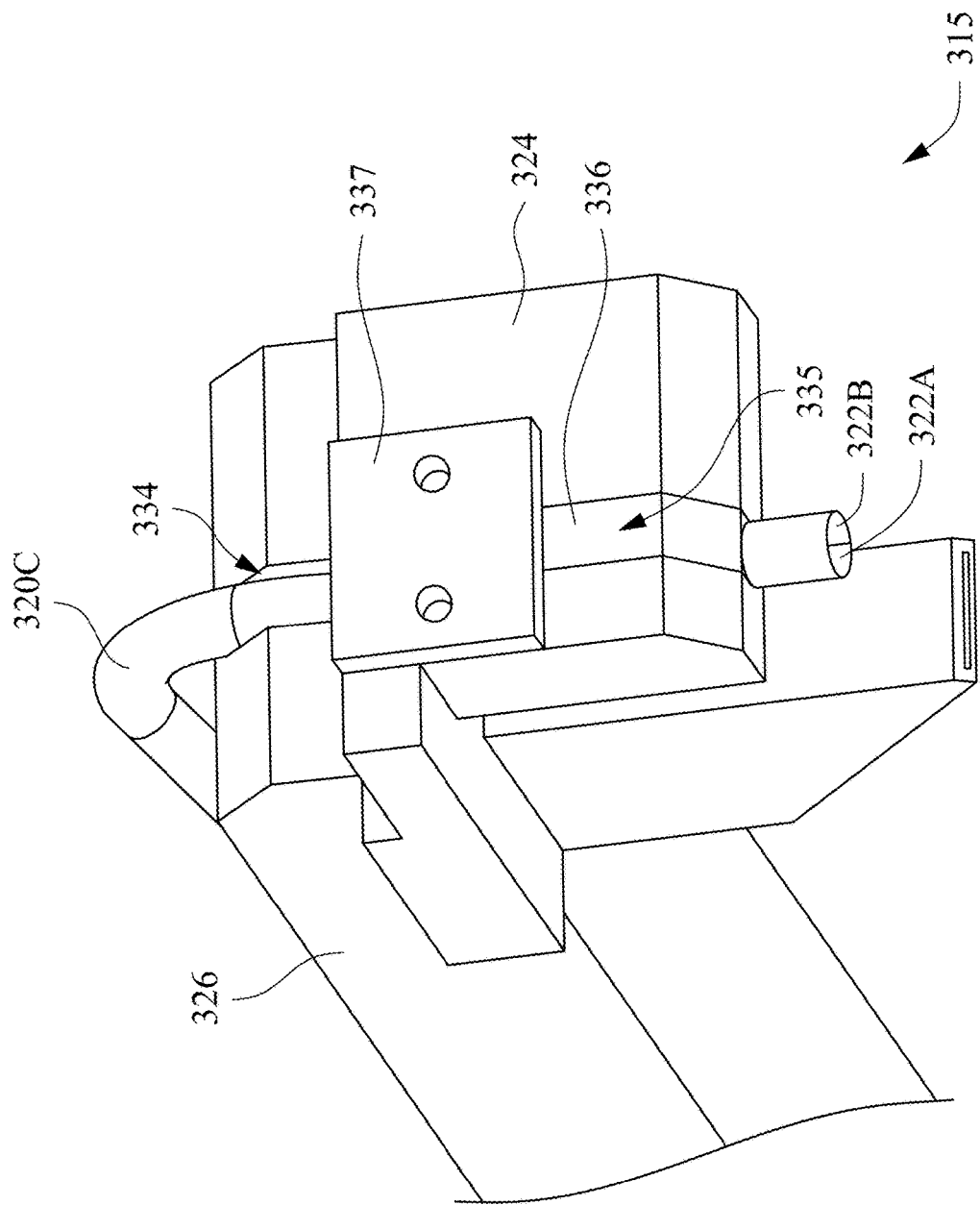
FIG. 3B is a zoomed-in/enlarged, three-quarter perspective view of a portion of FIG. 3A, in accordance with at least one embodiment of the present disclosure.

FIG. 3B is a zoomed-in/enlarged, three-quarter perspective view of a portion 331 of FIG. 3A, in accordance with at least one embodiment of the present disclosure.

In FIG. 3B, a groove 334 is formed in a surface of the distal portion of arm 326 and a surface of body/chassis 324. Groove 334 is configured to receive a segment of second portion 320C of conduit assembly 306, where second portion 320C includes lumens 322A and 322B. Nozzle assembly 315 further includes a plug 335 and a plate 337. Plug 336 is disposed in the portion of groove 334 so as to overlap the corresponding length of the segment of second portion 320C in groove 334. Plate 337 is disposed over plug 336 and is mounted to body/chassis 324, thereby confining plug 336 and second portion 320C in grove 334.

Figure 4:
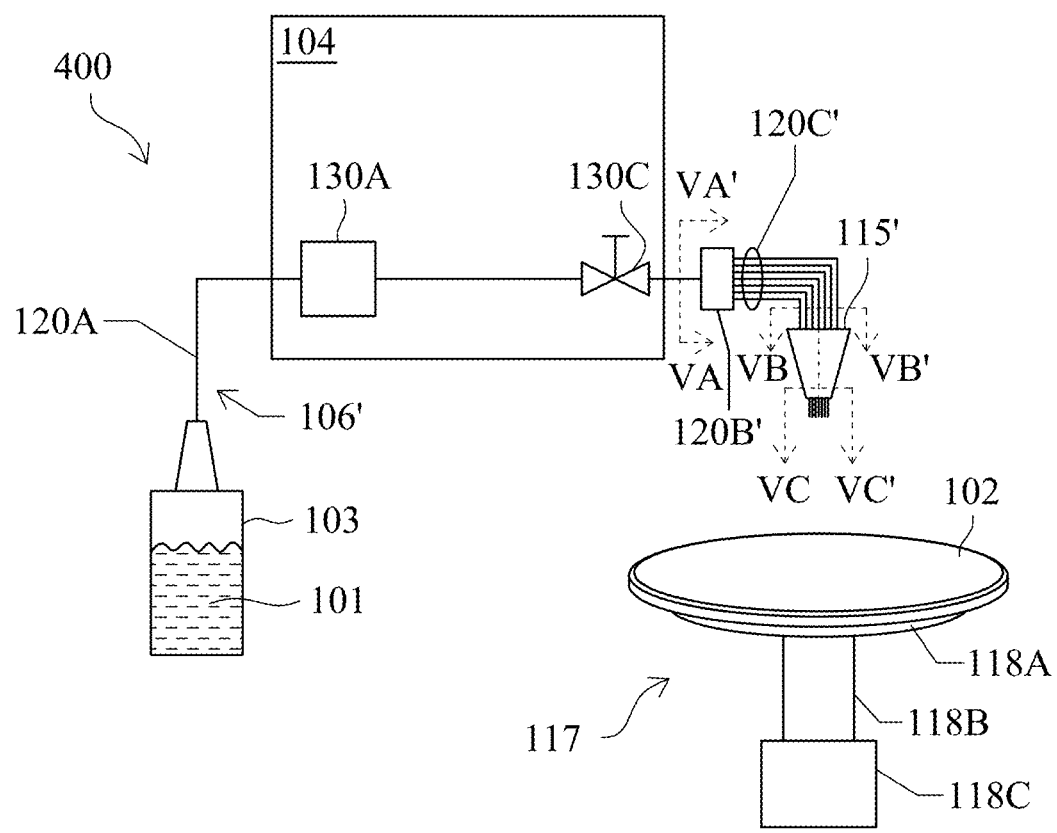
FIG. 4 is a diagram of another system for dispensing a liquid, in accordance with at least one embodiment of the present disclosure.

FIG. 4 is a diagram of a system 400 for dispensing a liquid, in accordance with at least one embodiment of the present disclosure. Some of the reference numerals in FIG. 4 correspond to reference numerals in FIG. 1 which reflects that FIG. 4 is a variation of FIG. 1.

In FIG. 4, manifolding portion 120B of conduit assembly 106 of FIG. 1 has been replaced with a manifold 120B' of a conduit assembly 106'. Also in FIG. 4, second portion 120C of conduit assembly 106 of FIG. 1 has been replaced by an arrangement 120C' of discrete tubes, where arrangement 120C' is included in conduit assembly 106'.

Arrangement 120C' has a second length and includes N discrete instances of a single-lumen tube, where N is a positive integer and N≥M. In some embodiments, N>M. Each instance of the single-lumen tube is coextensive with the second length. In FIG. 4, M is shown as 7 such that there are seven discrete single-lumen tubes in arrangement 120C'.

Figures 5A, 5B, 5C:
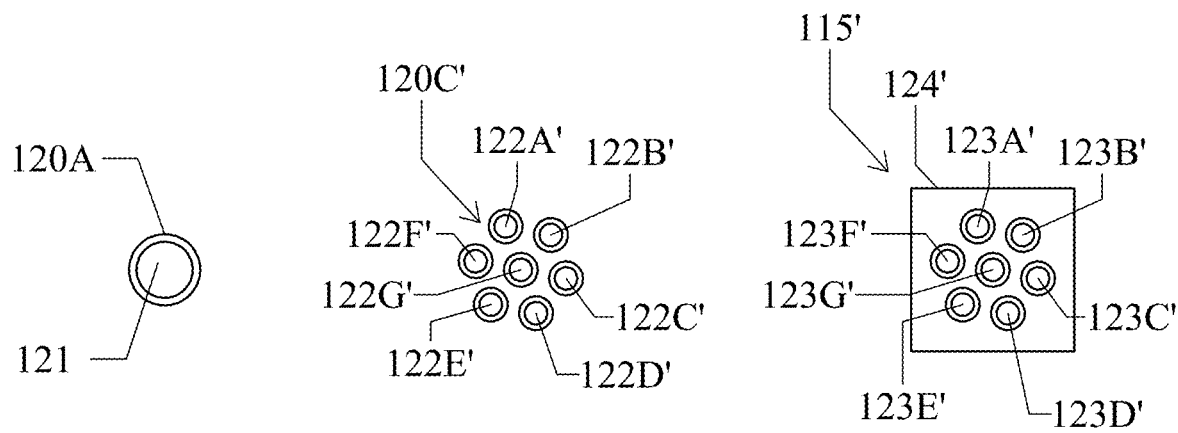
FIGS. 5A-5C are cross-sections of another conduit assembly, in accordance with at least one embodiment of the present disclosure.

FIGS. 5A-5C correspondingly illustrate cross-sections of first portion 120A of conduit assembly 106', arrangement 120C' and a nozzle assembly of FIG. 1, in accordance with at least one embodiment of the present disclosure.

FIG. 5A is the same as FIG. 2A. FIG. 5B shows seven instances, 122A' through 122G', of discrete single-lumen tubes in arrangement 120C'. FIG. 5C shows instances 122A' through 122G' of discrete single-lumen tubes in body/chassis 124' of nozzle assembly 115'.

Figure 6A:
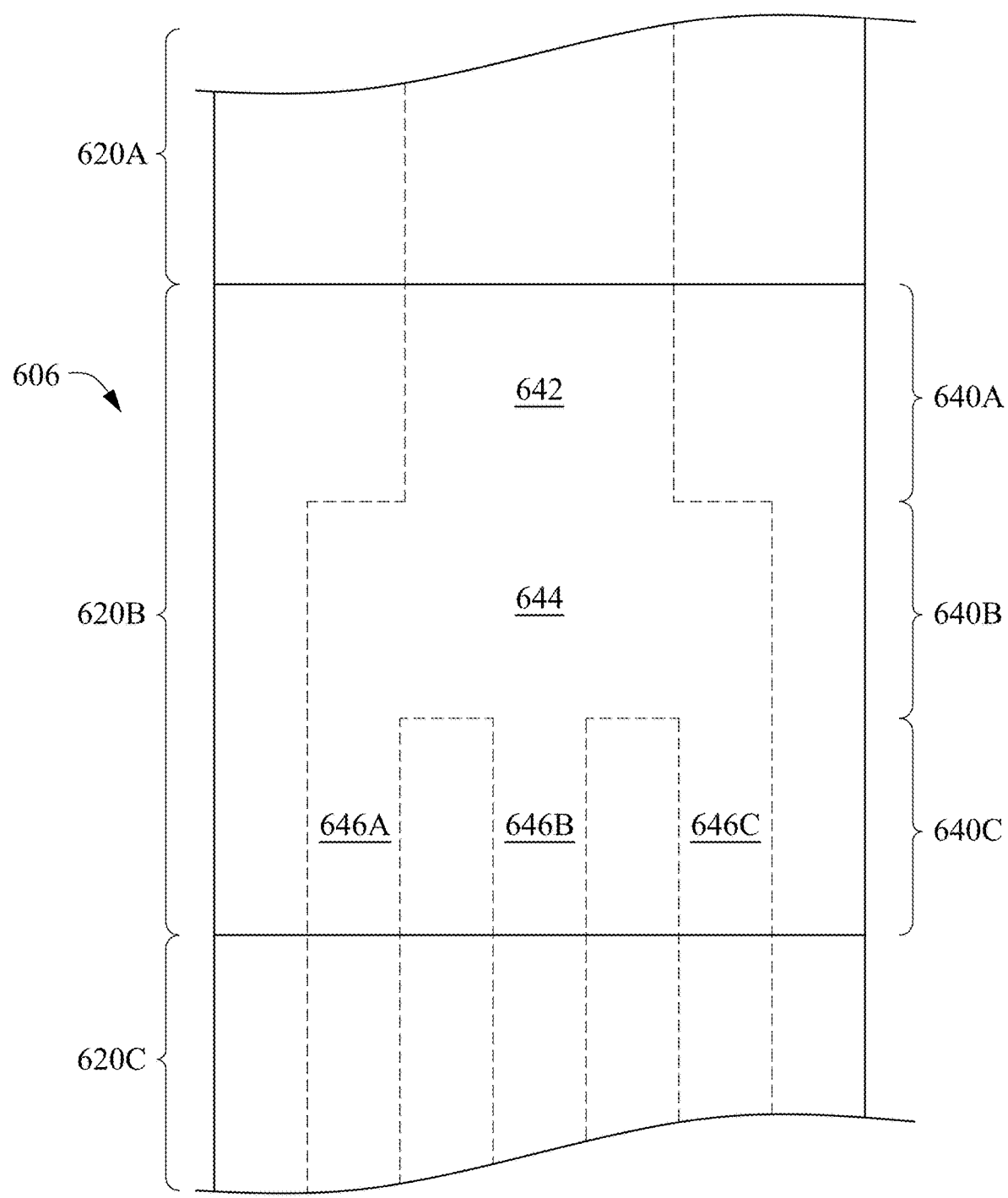
FIG. 6A is a cross-section of a conduit assembly, in accordance with at least one embodiment of the present disclosure.

FIG. 6A illustrates a cross-section of a conduit assembly 606, in accordance with at least one embodiment of the present disclosure. Some of the reference numerals in FIG. 6A correspond to reference numerals in FIG. 1 albeit increased by a factor of 500. For example, first portion 620A of FIG. 6A corresponds to first portion 120A of FIG. 1.

While similar, conduit assembly 606 also exhibits differences relative to conduit assembly 106 of FIG. 1. For example, second portion 620C of conduit assembly 606 includes three lumens whereas second portion 120C of includes two lumens.

Manifolding portion 620B fluidically connects first portion 620A to second portion 620C. Manifolding portion 620B includes a first stage 640A; a manifold 640B; and a second stage 640C. First stage 640A includes N instances of a third lumen which are correspondingly fluidically connected to, and correspondingly configured substantially the same as, the N instances of the first lumen of first portion 620A. Because N=1 in FIG. 1 such that there is one instance of the first lumen of first portion 620A, there is one instance 642 of the third lumen. Second stage 640C includes M instances of a fourth lumen which are correspondingly fluidically connected to, and correspondingly configured the same as, the M instances of the second lumen of second portion 620C. In FIG. 6A, M=3, so there are three instances 646A, 646B and 646C of the fourth lumen shown. Manifold 640B includes a chamber 644 to which are fluidically connected the instance 642 of the third lumen and instances 646A, 646B and 646C of the fourth lumen.

Figure 6B:
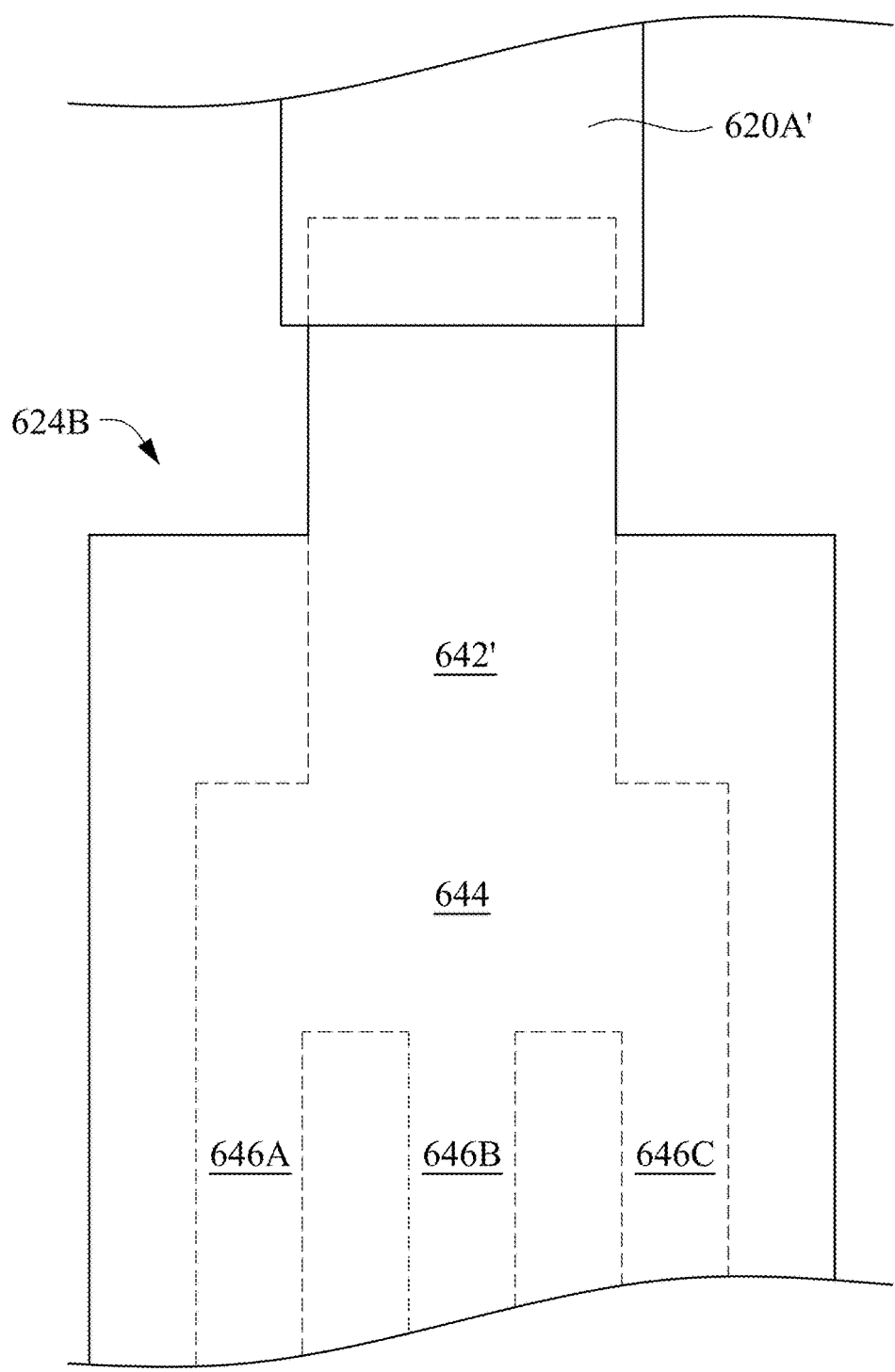
FIG. 6B is a cross-section of a body/chassis of a nozzle assembly, in accordance with at least one embodiment of the present disclosure.

FIG. 6B illustrates a cross-section of a body/chassis 624B of a nozzle assembly (not shown in FIG. 6B), in accordance with at least one embodiment of the present disclosure. Similar to FIG. 6A, some of the reference numerals in FIG. 6B correspond to reference numerals in FIG. 1 albeit increased by a factor of 500.

While similar, FIG. 6B also exhibits differences relative to FIG. 6A. In FIG. 6B, body/chassis 624B has replaced manifolding portion 120B and second portion 120C of conduit assembly 106 of FIG. 1. Similar to manifolding portion 620B of FIG. 6A, body/chassis 624B includes a chamber 644 to which are fluidically connected an instance 642' of the third lumen and instances 646A, 646B and 646C of the fourth lumen. Unlike instance 642 of the third lumen of manifolding portion 620B of FIG. 6A, instance 642' projects out of body/chassis 624B. An end of first portion 620A' fluidically connects with instance 642' of the third lumen by slipping circumferentially around and over instance 642' of the third lumen. In some embodiments, the end of first portion 620A' fluidically connects with instance 642' of the third lumen in a manner other than by slipping circumferentially around and over instance 642' of the third lumen. In some embodiments, an end of first portion 620A' fluidically connects with instance 642' of the third lumen by slipping circumferentially against albeit inside of instance 642' of the third lumen.

Figure 6C:
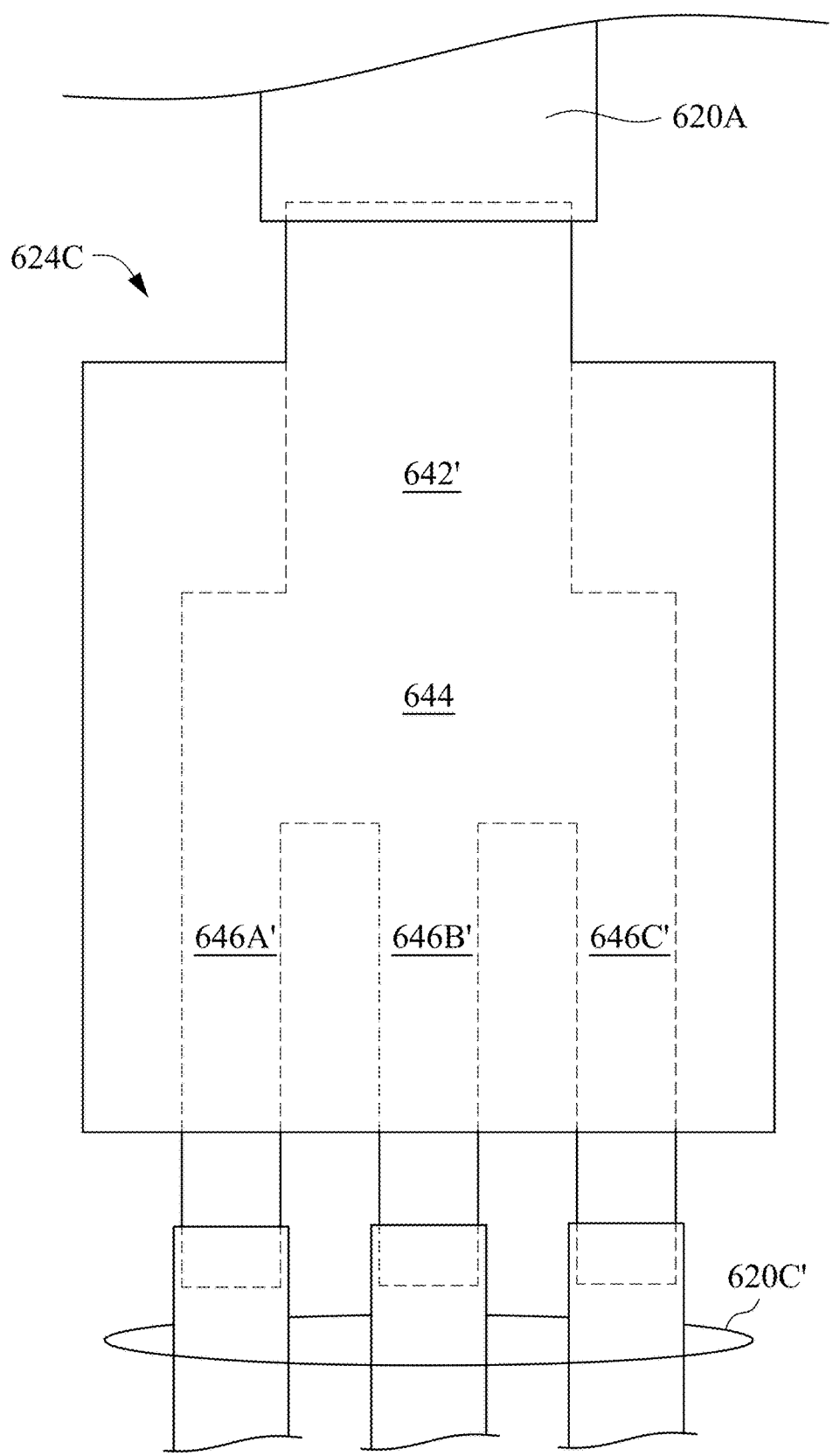
FIG. 6C illustrates a manifold, in accordance with at least one embodiment of the present disclosure.

FIG. 6C illustrates a manifold 624C, in accordance with at least one embodiment of the present disclosure. Similar to FIG. 6A, some of the reference numerals in FIG. 6B correspond to reference numerals in FIG. 1 albeit increased by a factor of 500.

While similar, manifold 624C of FIG. 6C also exhibits differences relative to body/chassis 624B of FIG. 6B.

Unlike instances 646A, 646B and 646C of the fourth lumen of body/chassis 624B of FIG. 6B, instances 646A', 646B' and 646C' of the fourth lumen of manifold 624C project out of the body of manifold 624C. Ends of the discrete single-lumen tubes in arrangement 620C' fluidically connect with corresponding instances 646A', 646B' and 646C' of the fourth lumen by slipping circumferentially around and over 646A', 646B' and 646C' of the fourth lumen. In some embodiments, the ends of the discrete single-lumen tubes in arrangement 620C' fluidically connect with corresponding instances 646A', 646B' and 646C' of the fourth lumen in a manner other than by slipping circumferentially around and over instances 646A', 646B' and 646C' of the fourth lumen. In some embodiments, the ends of the discrete single-lumen tubes in arrangement 620C' fluidically connect with corresponding instances 646A', 646B' and 646C' of the fourth lumen by slipping circumferentially against albeit inside instances 646A', 646B' and 646C' of the fourth lumen.

A nozzle assembly for use in liquid-dispensing system, the nozzle assembly including: a pipe having lumens; a body configured to receive the pipe such that an end of the pipe is mounted on the body; the pipe having a wall and a septum, wherein the wall encloses a space and the septum divides the space enclosed by the wall into lumens, wherein each of the lumens are correspondingly terminated in orifices such that a liquid is escapable from each lumen through the corresponding orifice and is thereby dispensable from the nozzle assembly; the pipe having a first flow-capacity to supply a first volume of the liquid at a first flow-rate and at a first pressure; each orifice and corresponding lumen having a second flow-capacity to supply a second volume of the liquid at a second flow-rate and at a second pressure.

A system for dispensing a liquid, the system including: a movable arm; a nozzle assembly mounted on the arm, the nozzle assembly being configured to dispense a liquid; the nozzle assembly including: a pipe for the liquid; and a body configured to receive the pipe; and wherein: the pipe has a wall and a septum, wherein the wall encloses a space and the septum divides the space enclosed by the wall into lumens, wherein each of the lumens are correspondingly terminated in orifices such that a liquid is escapable from each lumen through the corresponding orifice and is thereby dispensable from the nozzle assembly; the nozzle assembly has a first flow-capacity to supply a first volume of the liquid at a first flow-rate and at a first pressure; and each orifice and corresponding lumen has a second flow-capacity to supply a second volume of the liquid at a second flow-rate and at a second pressure.

A nozzle assembly including: a body mounted on a movable arm; and a pipe, an end of the pipe being mounted on the body, the pipe having a wall and a septum, wherein the wall encloses a space and the septum divides the space enclosed by the wall into lumens, wherein each of the lumens are correspondingly terminated in orifices such that a liquid is escapable from each lumen through the corresponding orifice; wherein, for a circumstance in which the liquid has a given chemical composition, flow of the liquid has been stopped, and the pipe is being subjected to movement by the movable arm, a cross-sectional area of each of the lumens produces a corresponding surface tension of the liquid which is sufficient to substantially prevent drippage of liquid from the actual orifice.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A nozzle assembly for use in liquid-dispensing system, the nozzle assembly comprising:
   a pipe having lumens;
   a body configured to receive the pipe such that an end of the pipe is mounted on the body;
   the pipe having a wall and a septum, wherein the wall encloses a space and the septum divides the space enclosed by the wall into the lumens, wherein each of the lumens is correspondingly terminated in an orifice such that a liquid is escapable from each lumen through the corresponding orifice and is thereby dispensable from the nozzle assembly;
   the pipe having a first flow-capacity to supply a first volume of the liquid at a first flow-rate and at a first pressure; and
   each orifice and corresponding lumen having a second flow-capacity to supply a second volume of the liquid at a second flow-rate and at a second pressure.

2. The nozzle assembly of claim 1, wherein:
   a cross-sectional area of each lumen is sized such that, for a circumstance in which the liquid has a given chemical composition, flow of the liquid has been stopped, and the pipe is being subjected to movement by a swing arm, the cross-sectional area of each of the lumens produces a corresponding surface tension of the liquid which is sufficient to substantially prevent drippage of liquid.

3. The nozzle assembly of claim 1, wherein:
   the pipe includes a first portion, a manifolding portion and a second portion that includes the lumens; and the manifolding portion being disposed between the first portion and the second portion.

4. The nozzle assembly of claim 1, wherein:
the pipe is of unitary construction.

5. The nozzle assembly of claim 1, wherein:
each lumen has a long axis and a cross-sectional area orthogonal to the long axis; and
a shape of each cross-sectional area of each lumen is a half-circle.

6. The nozzle assembly of claim 1, wherein:
the pipe has a long axis and a cross-sectional area orthogonal to the long axis; and
a shape of the cross-sectional area of the pipe is a bisected circle.

7. A system for dispensing a liquid, the system comprising:
a movable arm; and
a nozzle assembly mounted on the movable arm, the nozzle assembly being configured to dispense a liquid;
the nozzle assembly including:
a pipe for the liquid, the pipe having lumens; and
a body configured to receive the pipe; and
wherein:
the pipe has a wall and a septum, wherein the wall encloses a space and the septum divides the space enclosed by the wall into the lumens, wherein each of the lumens is correspondingly terminated in an orifice such that a liquid is escapable from each lumen through the corresponding orifice and is thereby dispensable from the nozzle assembly;
the nozzle assembly has a first flow-capacity to supply a first volume of the liquid at a first flow-rate and at a first pressure; and
each orifice and corresponding lumen has a second flow-capacity to supply a second volume of the liquid at a second flow-rate and at a second pressure.

8. The system of claim 7, wherein:
a cross-sectional area of each lumen is sized such that, for a circumstance in which the liquid has a given chemical composition, flow of the liquid has been stopped, and the pipe is being subjected to movement by the movable arm, the cross-sectional area of each of the lumens produces a corresponding surface tension of the liquid which is sufficient to substantially prevent drippage of liquid.

9. The system of claim 7, wherein:
a surface tension of the liquid is at least in part a function of a chemical composition of the given liquid; and
a cross-sectional area of each lumen is determined according to the chemical composition of the liquid.

10. The system of claim 7, further comprising:
a source of the liquid; and
wherein:
the pipe is directly fluidically connected to the nozzle assembly and at least indirectly fluidically connected to the source of the liquid; and
the lumens of the pipe are included in a multi-lumen portion which terminates in a multi-lumen end, the multi-lumen end of the pipe including the orifices of the nozzle assembly; and
the pipe further includes:
a single-lumen portion including a single lumen terminating in a single-lumen end; and
a manifolding portion fluidically connecting the multi-lumen end to the single-lumen end.

11. The system of claim 10, wherein:
the manifolding portion is of unitary construction.

12. The system of claim 10, wherein:
the pipe is a conduit assembly;
the single-lumen portion is a discrete element of the conduit assembly;
the multi-lumen portion and the manifolding portion are of unitary construction representing a manifold; and
the manifold is a discrete element of the conduit assembly.

13. The system of claim 7, wherein:
each lumen has a long axis and a cross-sectional area orthogonal to the long axis; and
a shape of each cross-sectional area of each lumen is a half-circle.

14. The system of claim 7, wherein:
the pipe has a long axis and a cross-sectional area orthogonal to the long axis; and
a shape of the cross-sectional area of the pipe is a bisected circle.

15. A nozzle assembly comprising:
a body mounted on a movable arm; and
a pipe, an end of the pipe being mounted on the body, the pipe having a wall and a septum, wherein the wall encloses a space and the septum divides the space enclosed by the wall into lumens, wherein each of the lumens is correspondingly terminated in an orifice such that a liquid is escapable from each lumen through the corresponding orifice; and
wherein, for a circumstance in which the liquid has a given chemical composition, flow of the liquid has been stopped, and the pipe is being subjected to movement by the movable arm, a cross-sectional area of each of the lumens produces a corresponding surface tension of the liquid which is sufficient to substantially prevent drippage of liquid from the corresponding orifice.

16. The nozzle assembly of claim 15, wherein:
the pipe is formed of an extrudable material so as to be of unitary construction.

17. The nozzle assembly of claim 15, wherein:
the pipe includes a first portion, a manifolding portion and a second portion having the lumens; and
the manifolding portion being disposed between the first portion and the second portion.

18. The nozzle assembly of claim 15, wherein:
each lumen has a long axis and a cross-sectional area orthogonal to the long axis; and
at least one of the following is true:
a first circumstance in which a shape of each cross-sectional area of each lumen is a half-circle; or
a second circumstance in which a shape of a cross-sectional area orthogonal to a long axis of the pipe is a bisected circle.

19. The nozzle assembly of claim 1, wherein:
each lumen has a first cross-sectional area orthogonal to a long axis of the lumen; and
a perimeter of each first cross-sectional area includes a substantially linear segment.

20. The system of claim 7, wherein:
each lumen has a first cross-sectional area orthogonal to a long axis of the lumen; and
a perimeter of each first cross-sectional area includes a substantially linear segment.

* * * * *